United States Patent
Newman

(10) Patent No.: US 10,476,145 B2
(45) Date of Patent: Nov. 12, 2019

(54) RADIO FREQUENCY SENSOR MODULE WITH MOUNTING EARS

(71) Applicant: CTS Corporation, Lisle, IL (US)

(72) Inventor: Robert L. Newman, Edwardsburg, MI (US)

(73) Assignee: CTS Corporation, Lisle, IL (US)

( * ) Notice: Subject to any disclaimer, the term of this patent is extended or adjusted under 35 U.S.C. 154(b) by 47 days.

(21) Appl. No.: 15/841,613

(22) Filed: Dec. 14, 2017

(65) Prior Publication Data

US 2018/0183141 A1 Jun. 28, 2018

Related U.S. Application Data

(60) Provisional application No. 62/437,736, filed on Dec. 22, 2016.

(51) Int. Cl.
| | |
|---|---|
| *H01Q 1/32* | (2006.01) |
| *B60R 11/02* | (2006.01) |
| *H04B 1/08* | (2006.01) |
| *H05K 5/02* | (2006.01) |
| *F01N 13/00* | (2010.01) |
| *F01N 13/18* | (2010.01) |
| *H05K 5/00* | (2006.01) |
| *B60R 11/00* | (2006.01) |
| *H01Q 1/28* | (2006.01) |

(52) U.S. Cl.
CPC ....... *H01Q 1/3275* (2013.01); *B60R 11/0205* (2013.01); *F01N 13/008* (2013.01); *F01N 13/1855* (2013.01); *H04B 1/082* (2013.01); *H05K 5/0039* (2013.01); *H05K 5/0204* (2013.01); *B60R 2011/004* (2013.01); *B60R 2011/0052* (2013.01); *F01N 2560/05* (2013.01); *F01N 2560/12* (2013.01); *H01Q 1/282* (2013.01); *H01Q 1/325* (2013.01); *H01Q 1/3266* (2013.01); *H01Q 1/3291* (2013.01)

(58) Field of Classification Search
CPC .. H01Q 1/3266; H01Q 1/3275; H01Q 1/3291; H01Q 1/282; H01Q 1/325
USPC .......................... 343/713, 711, 712; 324/636
See application file for complete search history.

(56) References Cited

U.S. PATENT DOCUMENTS

| | | | |
|---|---|---|---|
| 6,175,233 B1 | 1/2001 | McCurley et al. | |
| 8,384,397 B2 * | 2/2013 | Bromberg | F01N 3/025 324/636 |
| 2007/0101705 A1 | 5/2007 | Knitt | |

FOREIGN PATENT DOCUMENTS

| | | |
|---|---|---|
| EP | 3056707 A1 | 8/2016 |
| WO | 92/08138 A1 | 5/1992 |

\* cited by examiner

*Primary Examiner* — Joseph J Lauture
(74) *Attorney, Agent, or Firm* — Daniel Deneufbourg

(57) ABSTRACT

A radio frequency sensor module adapted for mounting a vehicle exhaust system structure. A bracket on the module includes a first mounting ear defining a first through aperture. A printed circuit board is coupled to the bracket. A cover defines an opening and an interior cavity in communication with the opening. The bracket and the cover are coupled together in a relationship with the printed circuit board extending through the opening in the cover and into the interior cavity of the cover and the first and second mounting ears in an abutting and overlying relationship. A mounting bolt extends through the respective first and second through apertures in the respective first and second mounting ears for securing the radio frequency module to the housing of a vehicle exhaust system.

14 Claims, 3 Drawing Sheets

RADIO FREQUENCY SENSOR MODULE WITH MOUNTING EARS

CROSS REFERENCE TO RELATED APPLICATION

This patent application claims priority and benefit of the filing date of U.S. Provisional Patent Application Ser. No. 62/437,736 filed on Dec. 22, 2016, the disclosure and contents of which is expressly incorporated herein in its entirety by reference.

FIELD OF THE INVENTION

This invention relates generally to a radio frequency sensor module and more specifically to a radio frequency sensor module with mounting ears.

BACKGROUND OF THE INVENTION

The present invention is directed to a radio frequency sensor or control module or unit adapted for use in connection with a vehicle exhaust control and sensor system of the type disclosed in U.S. Pat. No. 8,384,397 to Bromberg et al, the entire contents and disclosure of which is incorporated herein by reference as though fully set forth herein.

SUMMARY OF THE INVENTION

The present invention is generally directed to a radio frequency sensor module comprising a bracket including a first mounting ear defining a first through aperture, a printed circuit board coupled to the bracket, a cover defining an opening and an interior cavity in communication with the opening, the bracket and the cover being coupled together in a relationship with the printed circuit board extending through the opening in the cover and into the interior cavity of the cover and the first and second mounting ears in an abutting and overlying relationship, and a mounting bolt extending through the respective first and second through apertures in the respective first and second mounting ears for securing the radio frequency module to the housing of a vehicle exhaust system.

In one embodiment, the bracket includes a plate and the first mounting ear protrudes from the plate, the cover including a circumferential wall defining a radial end face defining the opening in the cover, the bracket and the cover being coupled together in a relationship with the radial end face of the cover abutting against the plate of the bracket.

In one embodiment, the cover and the bracket are clipped together.

In one embodiment, one of the circumferential wall of the cover or the plate of the bracket includes a flexible finger projecting outwardly therefrom and the other of the circumferential wall of the cover or the plate includes a through aperture defined therein, the finger extending through the opening for securing the cover to the plate of the bracket.

In one embodiment, a wire harness connector housing and a radio frequency antenna connectors extending from the plate of the bracket.

In one embodiment, a mounting insert extending through the respective first and second through apertures defined in the respective first and second mounting ears, the mounting bolt extending through the mounting insert.

In one embodiment, the mounting insert is a generally C-shaped plate.

In one embodiment, a pair of spaced apart arms protrude outwardly from the bracket, the printed circuit board extending between and coupled to the pair of spaced apart arms.

The present invention is also directed to a radio frequency sensor module comprising a bracket including a pair of arms and a first pair of mounting ears each defining a first through aperture, a printed circuit board, the pair of arms mounting the printed circuit board to the bracket, a cover defining an interior cavity and including a second pair of mounting ears each defining a second through aperture, the cover and the bracket being coupled together in a relationship with the printed circuit board extending into the interior cavity of the cover and the respective first and second pairs of mounting ears coupled together in an abutting and overlying relationship and the respective first and second through apertures in a co-linear relationship, and a pair of mounting bolts extending through the respective first and second through apertures of the respective first and second pairs of mounting ears coupled together for mounting the radio frequency sensor module to the housing of a vehicle exhaust system.

In one embodiment, the bracket includes a plate and the cover includes a circumferential wall including a radial end face, the cover and the bracket being coupled together in a relationship with the plate of the bracket abutted against the radial end face of the circumferential wall of the cover.

In one embodiment, a wire harness connector and a radio frequency antenna connector extend from the plate of the bracket.

In one embodiment, a mounting insert extends through the respective first and second through apertures of the respective first and second pairs of mounting ears, the pair of mounting bolts extending through the mounting insert.

In one embodiment, a gasket extends between the plate of the bracket and the radial end face of the cover for sealing the printed circuit board in the interior cavity of the cover.

In one embodiment, one of the plate of the bracket or the circumferential wall of the cover includes a plurality of spaced apart flexible fingers projecting outwardly therefrom and the other of the plate of the bracket or the circumferential wall of the cover includes a plurality of spaced apart through apertures, the plurality of fingers extending through the plurality of through holes respectively for clipping the cover to the bracket.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the description of the accompanying FIGS. as follows.

DESCRIPTION OF THE EMBODIMENT

Figure 1:
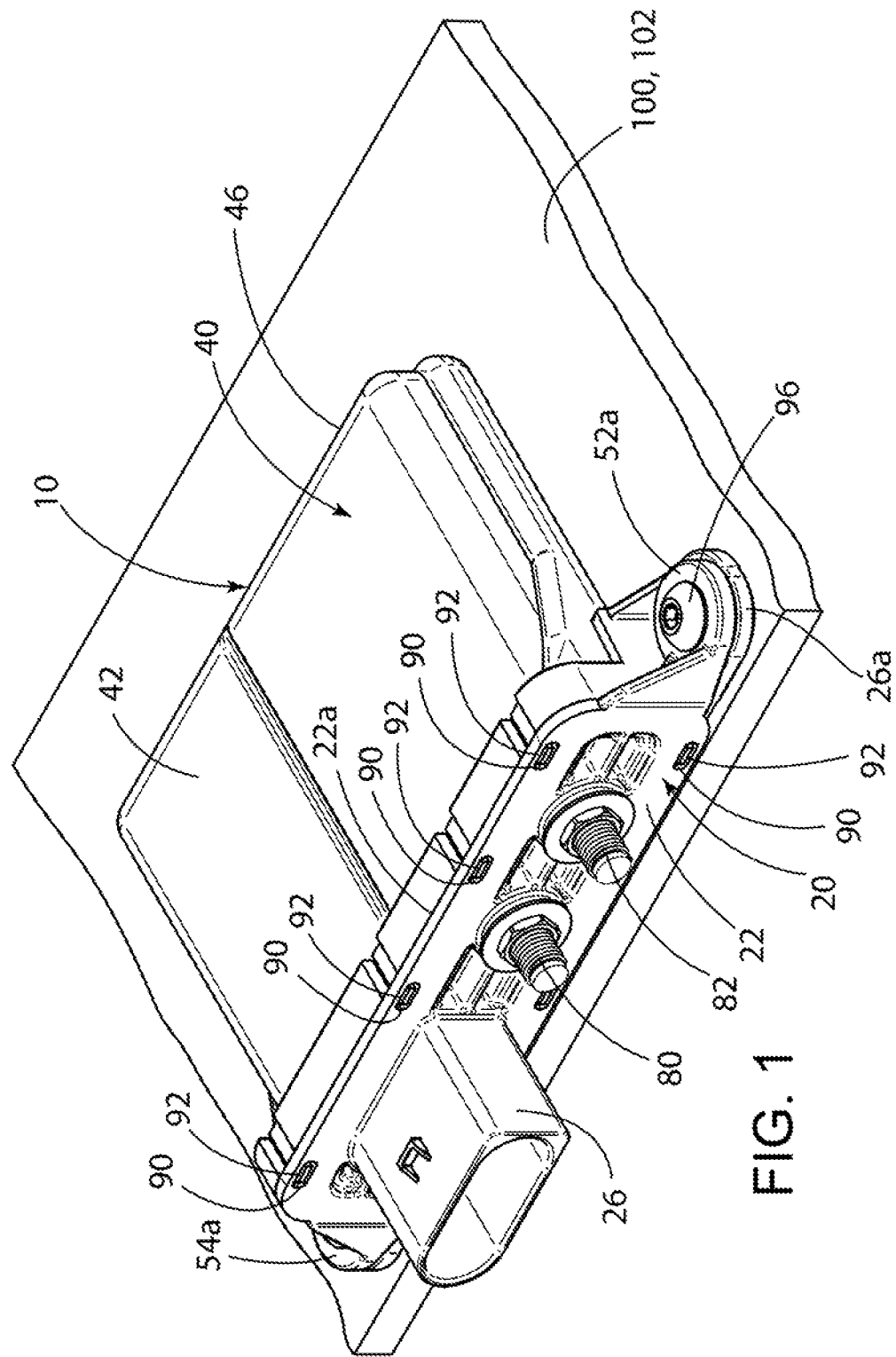
FIG. 1 is a perspective view of a radio frequency control module in accordance with the present invention mounted on the wall of the housing of a vehicle's exhaust system.
Figure 2:
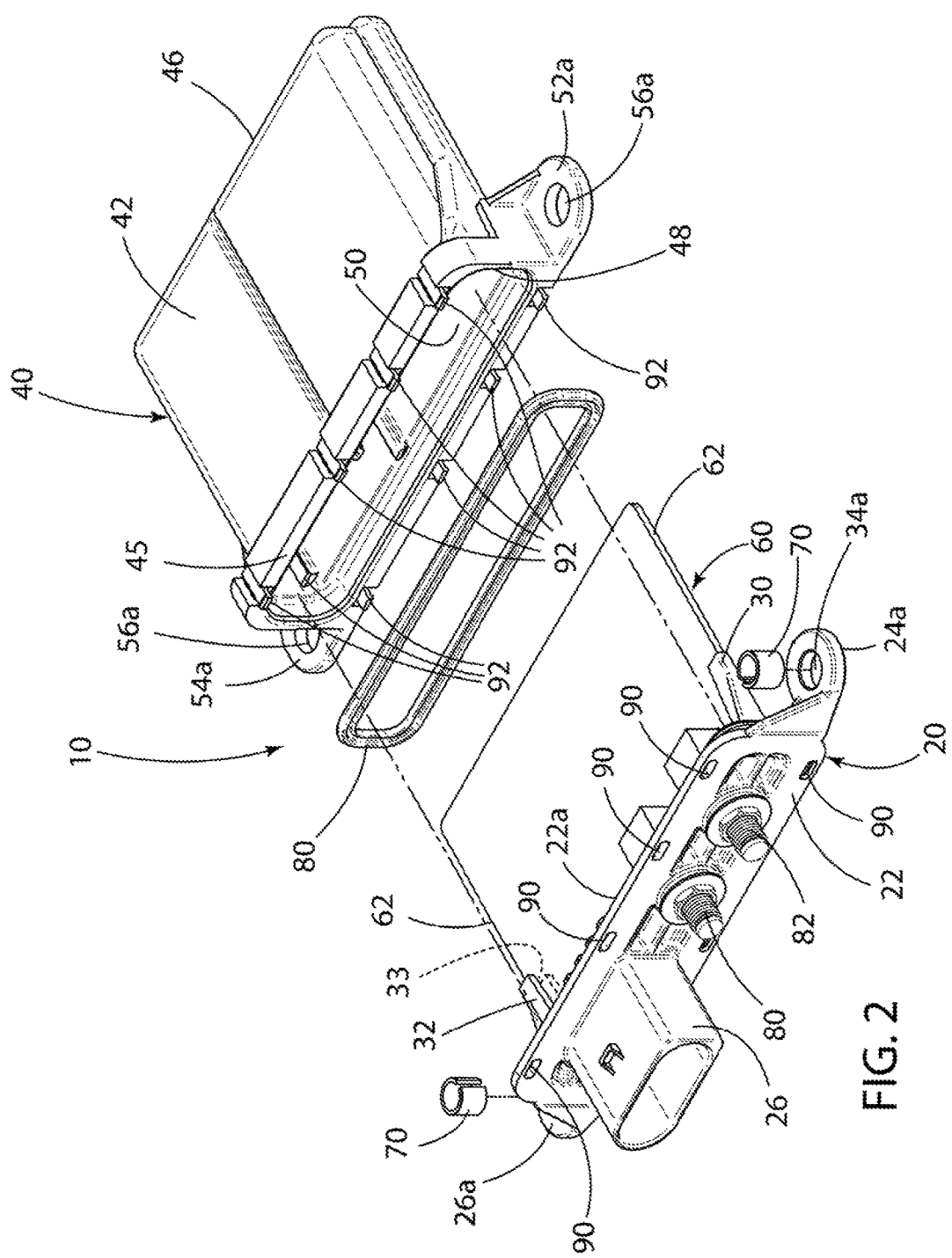
FIG. 2 is an exploded perspective view of the radio frequency control module shown in FIG. 1.

FIGS. 1 and 2 depict a radio frequency sensor and control module or unit 10 in accordance with the present invention which is adapted for use in connection with a vehicle exhaust control and sensor system of the type disclosed in U.S. Pat. No. 8,384,397 to Bromberg et al., the entire contents and disclosure of which is incorporated herein by reference as though fully set forth herein.

The radio frequency sensor or control module or unit 10 comprises the following main elements: a printed circuit board (PCB) retaining bracket 20, a printed circuit board (PCB) cover 40 that is coupled to the bracket 20, and a printed circuit board 60 coupled to and retained on the bracket 20 and extending into and housed in the interior of the cover 40.

The bracket 20 and the cover 40 may be made of any suitable thermoplastic material. The printed circuit board or substrate 60 may be made of any suitable printed circuit board or substrate material.

The PCB bracket 20 includes an elongate and generally vertical bracket plate 22, a pair of diametrically opposed mounting ears 24a and 26a projecting and extending unitarily horizontally outwardly from opposed distal ends of the bracket plate 22 in a direction and orientation generally normal to the direction and orientation of the plate 22, a wire harness connector housing 26 protruding outwardly from the front exterior vertical face of the plate 22, and a pair of printed circuit board mounting and retaining arms 30 and 32 protruding generally normally and horizontally unitarily outwardly from the back exterior face of, and in a direction and orientation generally normal to the direction and orientation of, the bracket plate 22.

The pair of printed circuit board arms 30 and 32 are positioned at opposed distal ends of the bracket plate 22 and, more specifically, are positioned relative to each other in a horizontal spaced-apart and generally parallel relationship.

Each of the printed circuit board arms 30 and 32 includes and defines an interior elongate open sleeve or recess 33 adapted to receive the opposed elongate edges 62 of the printed circuit board 60 for mounting and retaining the printed circuit board 60 on the bracket 20 in a horizontal relationship and direction normal to the direction and orientation of the vertical bracket plate 22.

Each of the mounting ears 24a and 26a is generally donut shaped and defines a central generally cylindrically shaped through-hole or aperture 34a adapted to receive a metal mounting insert 70.

Figures 4, 5:
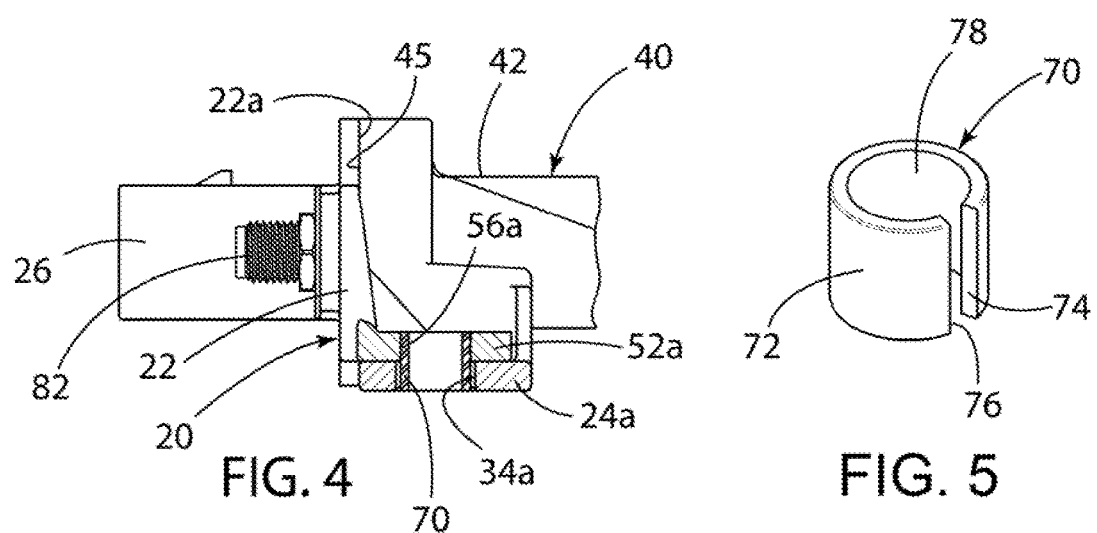
FIG. 4 is a part vertical plan view of the bracket and the cover and a part vertical cross-sectional view of the pair of abutting mounting ears shown in FIG. 3.
FIG. 5 is a perspective view of one of the mounting ear inserts of the radio frequency control module of the present invention.

As shown in FIG. 5, the mounting insert 70 comprises a sheet of metal 72 bent and shaped in the form of a C with opposed distal ends 74 and 76 thereof disposed in an opposed, spaced-apart, and facing relationship. The mounting insert 70 defines a central through-hole or aperture 78.

The printed circuit board 60 is flat and generally rectangular in shape. A plurality of electrical or electronic elements (not shown) are mounted on one or both of the exterior top and bottom surfaces or faces of the printed circuit board 60.

A pair of radio frequency antenna connectors 80 and 82 project outwardly from the front exterior face of the bracket plate 22, extend through the plate 22, and are coupled to the printed circuit board 60 and, more specifically, are electrically coupled to respective ones of the electrical components (not mounted on the printed circuit board 60.

A plurality of through holes 90 are defined in and extend around the periphery of the plate 22 of the bracket 20 in a spaced apart relationship.

The PCB cover 40 includes a circumferentially extending wall 42 defining a front peripheral circumferential radial face 45 defining a front opening 48. The PCB cover 40 also includes a back vertical wall 46 which together with the circumferential wall 42 defines an interior cavity or receptacle 50 in open communication with the front opening 48.

A plurality of flexible fingers 92 project outwardly from the front peripheral circumferential radial face 45 of the cover 40 and extend around the circumference of the circumferential radial end face 45 in a spaced apart relationship.

A pair of diametrically opposed and generally donut shaped mounting ears 52a and 54a project unitarily outwardly and horizontally from opposed ends of the lower portion of the circumferential wall 42 at a position adjacent the respective opposed ends of the front peripheral circumferential radial face 45. Each of the mounting ears 52a and 54a defines a central through aperture 56a.

In accordance with the present invention, the RF sensor module 10 is assembled as described in more detail below.

Initially, the printed circuit board 60 is slid onto and between and retained by the respective bracket arms 30 and 32 in a horizontal direction and orientation generally normal to the direction and orientation of the plate 22 of the bracket 20 and more specifically in a relationship with the respective opposed elongate edges 62 of the printed circuit board 60 are received in the respective sleeves defined in the respective bracket arms 30 and 32 and further in a relationship with the front peripheral exterior end face of the printed circuit board 60 in abutting relationship with the back exterior face of the bracket plate 22 and still further with the respective radio frequency antenna connectors 80 and 82 in electrical coupling relationship with the respective electrical components (not shown) on the printed circuit board 60.

Thereafter, the PCB cover 40 is coupled and secured to the PCB bracket 20. Particularly, the printed circuit board 60 is extended into and through the cover opening 48 and into the interior cover cavity 50 into a relationship with the front radial end face 45 of the cover 40 abutting against the back exterior face 22a of the bracket plate 22 and still more specifically into a relationship with the respective cover mounting ears 52a and 54a and the respective bracket mounting ears 24a and 26a positioned in a overlying and abutting relationship as more particularly shown in FIGS. 3 and 4 and still more specifically in a relationship with the respective mounting ear through holes 56a and 34a defined in the respective mounting ears 52a and 54a and 24a and 26a co-linearly aligned with each other.

Moreover, and as shown in FIG. 1, the respective flexible clip fingers 92 projecting from the cover 40 extend through the respective through holes 90 in the plate 22 of the bracket 20 and are clipped to the plate 22 of the bracket 20 for coupling the cover 40 and the bracket 20 together.

A gasket 80 as shown in FIG. 2 is inserted and wedged between the radial circumferential end face 45 of the cover 40 and the back exterior face 22a of the bracket plate 22 for sealing the printed circuit board 60 and more specifically the electrical components thereon from contamination during use of the RF sensor module 10 in for example the exhaust system of a vehicle.

Figure 3:
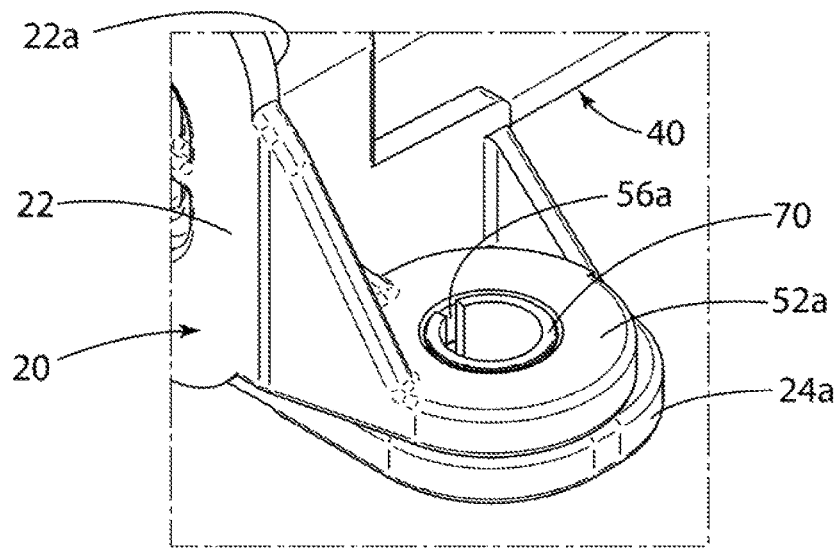
FIG. 3 is an exploded perspective view of one of the pairs of abutting mounting ears on the bracket and cover of the radio frequency control module shown in FIGS. 1 and 2.

As shown in FIGS. 2 and 3, a pair of the mounting inserts 70 are then inserted into the respective mounting ear through holes 56a and 34a defined in the respective mounting ears 52a and 54a and 24a and 26a.

Thereafter, as shown in FIG. 1, a mounting bolt 96 is inserted through the respective mounting ear through-holes 56a and 34a and, more specifically, through the respective mounting ear inserts 70 for mounting the RF sensor module 10 to the wall 100 of the housing 102 of a vehicle's exhaust system with the exterior face of the lower portion of the circumferential wall 42 of the cover 40 abutted against the exterior upper face of the wall 100 and still more specifically with the exterior lower face of the respective mounting ears 24a and 26a of the bracket 20 abutted against the exterior upper face of the wall 100.

Numerous variations and modifications of the radio frequency sensor module described above may be effected without departing from the spirit and scope of the novel features of the invention. It is to be understood that no limitations with respect to the specific radio frequency sensor module illustrated herein are intended or should be inferred. It is, of course, intended to cover by the appended claims all such modifications as fall within the scope of the claims.

What is claimed is:

1. A radio frequency sensor module comprising:
   a bracket including a first mounting ear defining a first through aperture;
   a printed circuit board coupled to the bracket;
   a cover defining an opening and an interior cavity in communication with the opening, the bracket and the cover being coupled together by the printed circuit board and extending through the opening in the cover and into the interior cavity of the cover and the first and second mounting ears, the first mounting ear in a position abutting against and overlying with the second mounting ear; and
   a mounting bolt extending through respective first and second through apertures in the respective first and second mounting ears for securing the radio frequency module to the housing of a vehicle exhaust system.

2. The radio frequency sensor module of claim 1 wherein the bracket includes a plate and the first mounting ear protrudes from the plate, the cover including a circumferential wall defining a radial end face defining the opening in the cover, the bracket and the cover being coupled together by the radial end face of the cover abutting against the plate of the bracket.

3. The radio frequency sensor module of claim 2 further comprising a wire harness connector housing and a radio frequency antenna connectors extending from the plate of the bracket.

4. The radio frequency sensor module of claim 1 wherein the cover and the bracket are clipped together.

5. The radio frequency sensor module of claim 4 wherein one of the circumferential wall of the cover or the plate of the bracket includes a flexible finger projecting outwardly therefrom and the other of the circumferential wall of the cover or the plate includes a through aperture defined therein, the finger extending through the opening for securing the cover to the plate of the bracket.

6. The radio frequency sensor module of claim 1 further comprising a mounting insert extending through respective first and second through apertures defined in the respective first and second mounting ears, the mounting bolt extending through the mounting insert.

7. The radio frequency sensor module of claim 6 wherein the mounting insert is a generally C-shaped plate.

8. The radio frequency sensor module of claim 1 further comprising a pair of spaced apart arms protruding outwardly from the bracket, the printed circuit board extending between and coupled to the pair of spaced apart arms.

9. A radio frequency sensor module comprising:
   a bracket including a pair of arms and a first pair of mounting ears each defining a first through aperture;
   a printed circuit board, the pair of arms mounting the printed circuit board to the bracket;
   a cover defining an interior cavity and including a second pair of mounting ears each defining a second through aperture, the cover and the bracket being coupled together by the printed circuit board extending into the interior cavity of the cover and the respective first and second pairs of mounting ears coupled together in an abutting and overlying relationship and the respective first and second through apertures in a co-linear relationship; and
   a pair of mounting bolts extending through the respective first and second through apertures of the respective first and second pairs of mounting ears coupled together for mounting the radio frequency sensor module to the housing of a vehicle exhaust system.

10. The radio frequency sensor module of claim 9 wherein the bracket includes a plate and the cover includes a circumferential wall including a radial end face, the cover and the bracket being coupled together by the plate of the bracket abutting against the radial end face of the circumferential wall of the cover.

11. The radio frequency sensor module of claim 10 wherein a wire harness connector and a radio frequency antenna connector extend from the plate of the bracket.

12. The radio frequency sensor module of claim 10 further comprising a gasket extending between the plate of the bracket and the radial end face of the cover for sealing the printed circuit board in the interior cavity of the cover.

13. The radio frequency sensor module of claim 10 wherein one of the plate of the bracket or the circumferential wall of the cover includes a plurality of spaced apart flexible fingers projecting outwardly therefrom and the other of the plate of the bracket or the circumferential wall of the cover includes a plurality of spaced apart through apertures, the plurality of fingers extending through a plurality of through holes respectively for clipping the cover to the bracket.

14. The radio frequency sensor module of claim 9 further comprising a mounting insert extending through the respective first and second through apertures of the respective first and second pairs of mounting ears, the pair of mounting bolts extending through the mounting insert.

* * * * *